US009613716B2

(12) United States Patent
Kim et al.

(10) Patent No.: US 9,613,716 B2
(45) Date of Patent: Apr. 4, 2017

(54) SEMICONDUCTOR DEVICE AND SEMICONDUCTOR SYSTEM INCLUDING THE SAME

(71) Applicant: SK hynix Inc., Icheon-si, Gyeonggi-do (KR)

(72) Inventors: Min Chang Kim, Seoul (KR); Woo Yeol Shin, Seoul (KR); Noh Hyup Kwak, Seoul (KR)

(73) Assignee: SK HYNIX INC., Icheon-si (KR)

( * ) Notice: Subject to any disclaimer, the term of this patent is extended or adjusted under 35 U.S.C. 154(b) by 48 days.

(21) Appl. No.: 14/568,229

(22) Filed: Dec. 12, 2014

(65) Prior Publication Data

US 2016/0064101 A1 Mar. 3, 2016

(30) Foreign Application Priority Data

Aug. 28, 2014 (KR) ........................ 10-2014-0113490

(51) Int. Cl.
*G11C 29/12* (2006.01)
*G11C 7/22* (2006.01)
(52) U.S. Cl.
CPC .......... *G11C 29/1201* (2013.01); *G11C 7/222* (2013.01); *G11C 29/12015* (2013.01)

(58) Field of Classification Search
USPC ........................................... 257/666; 365/189
See application file for complete search history.

(56) References Cited

U.S. PATENT DOCUMENTS

| 2011/0084722 A1 | 4/2011 | Nishioka | |
| 2011/0278479 A1* | 11/2011 | Chan | H02J 50/30 250/551 |
| 2015/0255131 A1* | 9/2015 | Byeon | G11C 5/04 365/230.03 |

FOREIGN PATENT DOCUMENTS

KR 1020140003229 A 1/2014

\* cited by examiner

*Primary Examiner* — Zandra Smith
*Assistant Examiner* — Lawrence Tynes, Jr.
(74) *Attorney, Agent, or Firm* — William Park & Associates Ltd.

(57) ABSTRACT

A semiconductor system may include a first semiconductor device including a first pad group. The semiconductor system may include a second semiconductor device including a second pad group which is configured for input and output of signals from and to a third semiconductor device. The second semiconductor device may include a selective transfer unit configured to electrically couple the third pad group to the first pad group or to an interface unit electrically coupled to the first pad group, in response to a test mode enable signal.

20 Claims, 8 Drawing Sheets

SEMICONDUCTOR DEVICE AND SEMICONDUCTOR SYSTEM INCLUDING THE SAME

CROSS-REFERENCE TO RELATED APPLICATION

The present application claims priority under 35 U.S.C. §119(a) to Korean application number 10-2014-0113490, filed on Aug. 28, 2014, in the Korean Intellectual Property Office, which is incorporated herein by reference in its entirety.

BACKGROUND

1. Technical Field

Embodiments of the present disclosure generally relate to a semiconductor system including a semiconductor device.

2. Related Art

Some packaging technologies for placing a high capacity memory and a controller into the same package include an SiP (System in Package) packaging technology and a CoC (Chip on Chip) packaging technology. The SiP packaging technology adopts a scheme whereby chips are electrically coupled through wire bonding. The CoC packaging technology is most advantageous for realizing the high integration of a memory and for realizing a high speed operation between a memory and a controller. This is because the memory and the controller transmit signals including data to each other through micro bump pads.

Since the diameter of a micro bump pad can be only several tens of micrometers, properties such as resistance, inductance and parasitic capacitance are low. Thus, these properties may it easier to increase an operation frequency. Therefore, the transmission speed of the data may be easily improved by a method of increasing the number of micro bump pads. In the CoC packaging technology, micro bump pads are formed on the memory and the controller. Because the micro bump pads formed on the memory and the controller are electrically coupled with each other, the memory and the controller are formed as one chip.

In a semiconductor device, in order to ensure the performance of a buffer through which data is inputted and outputted or a driver, a data input/output test may be performed. In the case where the test is performed for a semiconductor device and a semiconductor system in which the CoC packaging technology is used, data may be inputted and outputted through micro bump pads.

SUMMARY

In an embodiment, a semiconductor system may include a first semiconductor device including a first pad group. The semiconductor system may include a second semiconductor device including a second pad group electrically coupled with the first pad group and a third pad group for input and output of signals from and to a third semiconductor device. The second semiconductor device may include a selective transfer unit configured to electrically couple the third pad group to the first pad group or to an interface unit electrically coupled to the first pad group, in response to a test mode enable signal.

In an embodiment, a semiconductor system may include a first semiconductor device including a first pad group. The semiconductor system may include a second semiconductor device including a second pad group electrically coupled with the first pad group and a third pad group for input and output of signals from and to a third semiconductor device. The second semiconductor device may include an interface unit configured to detect a phase information signal, the phase information signal including information on a phase difference of a first interface signal and a second interface signal inputted through the third pad group, and outputs the phase information signal to the third pad group.

In an embodiment, a semiconductor system may include a first semiconductor device including a first pad group, and configured to output data and a data strobe signal. The semiconductor system may include a second semiconductor device including a second pad group electrically coupled with the first pad group and a third pad group for input and output of signals from and to a third semiconductor device. The second semiconductor device may include an interface unit configured to receive the data and the data strobe signal, generate internal data from the data in synchronization with the data strobe signal or an external data strobe signal, and output the internal data to the third pad group.

DETAILED DESCRIPTION

Hereinafter, a semiconductor device and a semiconductor system including the same will be described below with reference to the accompanying drawings through various examples of embodiments.

Various embodiments may be directed to a semiconductor system capable of testing the interface characteristic of a semiconductor device including micro bump pads.

Figure 1:
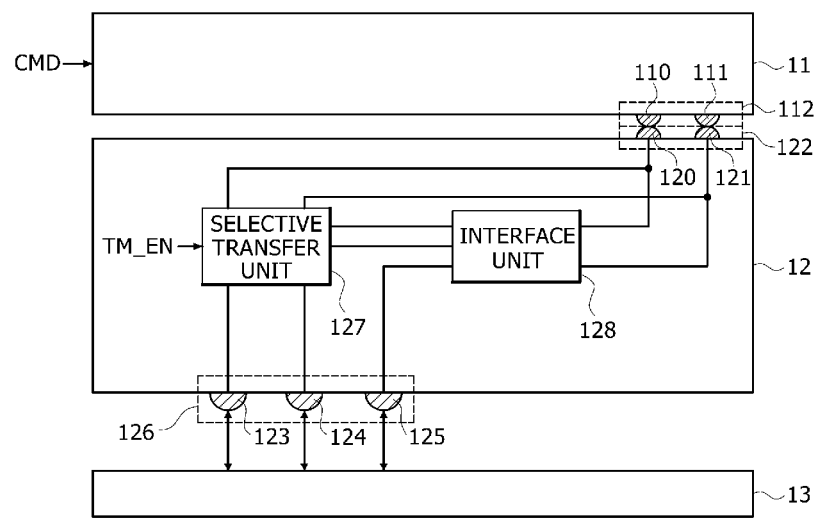
FIG. 1 is a block diagram illustrating a representation of an example of the configuration of a semiconductor system in accordance with an embodiment.

Referring to FIG. 1, a semiconductor system in accordance with an embodiment may include a first semiconductor device 11, a second semiconductor device 12, and a third semiconductor device 13. The first semiconductor device 11 may include a first pad group 112. The first pad group may be configured by a first pad 110 and a second pad 111. The first semiconductor device 11 may receive a command CMD. The second semiconductor device 12 may include a second pad group 122, a third pad group 126, a selective transfer unit 127, and an interface unit 128. The second pad group 122 may be configured by a third pad 120 and a fourth pad 121. The third pad group 126 may be configured by a fifth pad 123, a sixth pad 124, and a seventh pad 125. The first pad group 112 may be electrically coupled with the second pad group 122. The second semiconductor device 12 outputs signals to the third semiconductor device 13 or is inputted with signals from the third semiconductor device 13, through the third pad group 126. The first pad 110, the second pad 111, the third pad 120 and the fourth pad 121 may be realized by micro bump pads.

The selective transfer unit 127 electrically couples the fifth pad 123 and the sixth pad 124 to the interface unit 128 or electrically couples the fifth pad 123 and the sixth pad 124 to the first pad 110 and the second pad 111, in response to a test mode enable signal TM_EN. The test mode enable signal TM_EN may be enabled in the case of entering a test mode. The selective transfer unit 127 electrically couples the fifth pad 123 and the sixth pad 124 to the interface unit 128 in the case of entering the test mode, and electrically couples the fifth pad 123 and the sixth pad 124 to the first pad 110 and the second pad 111 in the case of not entering the test mode.

The interface unit 128 is inputted with first and second interface signals (not shown) through the fifth pad 123 and the sixth pad 124 in the test mode. The interface unit 128 outputs information on the phase difference of the first and second interface signals, to the seventh pad 125. The interface unit 128 transfers the first and second interface signals to the first semiconductor device 11 through the first pad group 112 and the second pad group 122. Each of the first and second interface signals may be set to include one of a command, an address, data, a clock and a data strobe signal. The configuration and operation of such an interface unit 128 will be described below with reference to FIGS. 2 to 4.

The interface unit 128 receives data (not shown) and a data strobe signal (not shown) from the first semiconductor device 11 through the first pad group 112 and the second pad group 122 in the test mode. The interface unit 128 generates internal data from the data in synchronization with the data strobe signal or an external data strobe signal (not shown. The interface unit 128 outputs the generated internal data to the third semiconductor device 13 through the third pad group 126. The external data strobe signal is inputted from the third semiconductor device 13 through the third pad group 126. The configuration and operation of such an interface unit 128 will be described later with reference to FIGS. 5 to 7.

Figure 2:
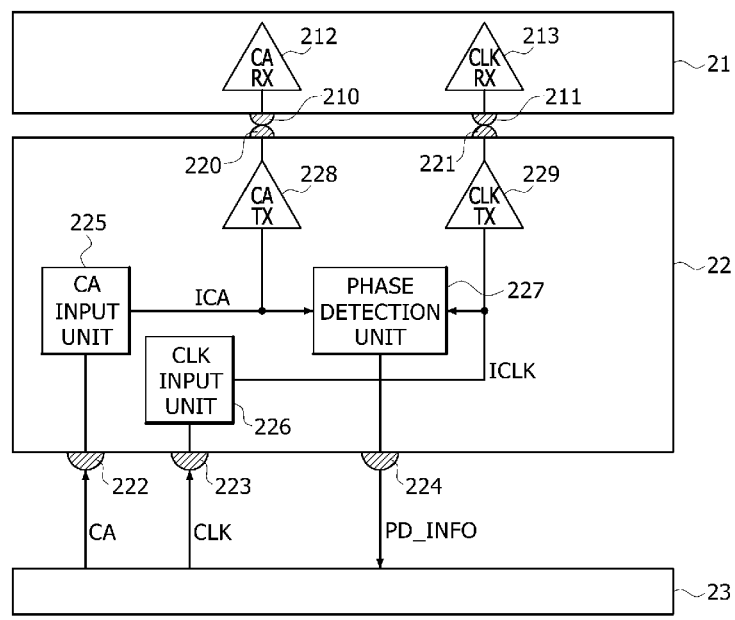
FIG. 2 is a block diagram illustrating a representation of an example of the configuration of a semiconductor system in accordance with an embodiment.

Referring to FIG. 2, a semiconductor system in accordance with an embodiment may include a first semiconductor device 21, a second semiconductor device 22, and a third semiconductor device 23. The first semiconductor device 21 is configured by a first pad 210, a second pad 211, a command/address reception (CARX) unit 212, and a clock reception (CLKRX) unit 213. The second semiconductor device 22 may include a third pad 220, a fourth pad 221, and a fifth pad 222. The second semiconductor device 22 may include a sixth pad 223, a seventh pad 224, and a command/address (CA) input unit 225. The second semiconductor device 22 may include a clock (CLK) input unit 226, and a phase detection unit 227. The second semiconductor device 22 may include a command/address transmission (CATX) unit 228, and a clock transmission (CLKTX) unit 229. The first pad 210 and the third pad 220 are electrically coupled, and the second pad 211 and the fourth pad 221 are electrically coupled. The first pad 210, the second pad 211, the third pad 220 and the fourth pad 221 may be realized by micro bump pads.

The command/address input unit 225 is applied with a command/address CA from the third semiconductor device 23 through the fifth pad 222, and generates an internal command/address ICA. The clock input unit 226 is applied with a clock CLK from the third semiconductor device 23 through the sixth pad 223, and generates an internal clock ICLK. The phase detection unit 227 detects the phase difference of the internal command/address ICA and the internal clock ICLK, and generates a phase information signal PD_INFO. The phase detection unit 227 outputs the phase information signal PD_INFO to the third semiconductor device 23 through the seventh pad 224. The command/address reception unit 212 receives the internal command/address ICA transmitted from the command/address transmission unit 228, through the first pad 210 and the third pad 220. The clock reception unit 213 receives the internal clock ICLK transmitted from the clock transmission unit 229, through the second pad 211 and the fourth pad 221.

In the semiconductor systems configured as mentioned above, when the command/address CA and the clock CLK are applied to the first semiconductor device 21 through the second semiconductor device 22, the timing difference between the command/address CA and the clock CLK may be detected and corrected. The third semiconductor device 23 applies the command/address CA to the second semiconductor device 22 by sequentially changing the input timing of the command/address CA while fixing the input timing of the clock CLK. According to an embodiment, the third semiconductor device 23 may be realized in such a manner that it applies the clock CLK to the second semiconductor device 22 by sequentially changing the input timing of the clock CLK while fixing the input timing of the command/address CA. The second semiconductor device 22 generates the phase information signal PD_INFO including information on the phase difference of the clock CLK and the command/address CA, and applies the phase information signal PD_INFO to the third semiconductor device 23. The third semiconductor device 23 may detect and correct the phase difference of the clock CLK and the command/address CA, based on the phase information signal PD_INFO. For example, the third semiconductor device 23 may apply the command/address CA to the second semiconductor device 22 with input timings that are delayed by −0.15 tck, −0.1 tck, 0 tck, 0.1 tck and 0.15 tck when compared to the input timing of the clock CLK. In the examples where the phase information signal PD_INFO generated in the second semiconductor device 22 level-transitions at −0.1 tck, the third semiconductor device 23 may detect that the input timing of the command/address CA is earlier than the input timing of the clock CLK, and may perform a correction of delaying the input timing of the command/address CA by 0.1 tck.

Figure 3:
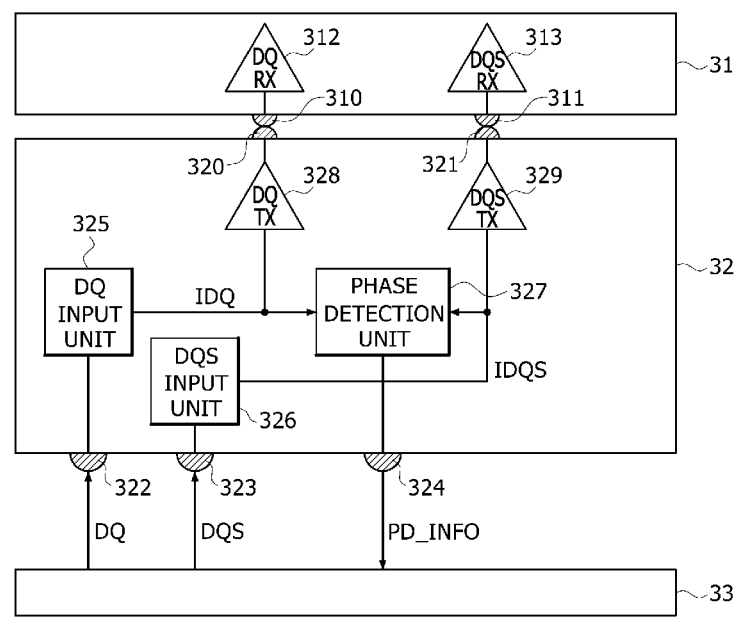
FIG. 3 is a block diagram illustrating a representation of an example of the configuration of a semiconductor system in accordance with an embodiment.

Referring to FIG. 3, a semiconductor system in accordance with an embodiment may include a first semiconductor device 31, a second semiconductor device 32, and a third semiconductor device 33. The first semiconductor device 31 may be configured by a first pad 310, a second pad 311, a data reception (DQRX) unit 312, and a data strobe signal reception (DQSRX) unit 313. The second semiconductor device 32 may include a third pad 320, a fourth pad 321, and a fifth pad 322. The second semiconductor device 32 may include a sixth pad 323, a seventh pad 324, a data (DQ) input unit 325. The second semiconductor device 32 may include a data strobe (DQS) signal input unit 326, a phase detection unit 327, a data transmission (DQTX) unit 328, and a data strobe signal transmission (DQSTX) unit 329. The first pad 310 and the third pad 320 are electrically coupled, and the second pad 311 and the fourth pad 321 are electrically coupled. The first pad 310, the second pad 311, the third pad 320, and the fourth pad 321 may be realized by micro bump pads.

The data input unit 325 is applied with data DQ from the third semiconductor device 33 through the fifth pad 322, and generates internal data IDQ. The data strobe signal input unit 326 is applied with a data strobe signal DQS from the third semiconductor device 33 through the sixth pad 323, and generates an internal data strobe signal IDQS. The phase detection unit 327 detects the phase difference of the internal data IDQ and the internal data strobe signal IDQS, and generates a phase information signal PD_INFO. The phase detection unit 327 outputs the phase information signal PD_INFO to the third semiconductor device 33 through the seventh pad 324. The data reception unit 312 receives the internal data IDQ transmitted from the data transmission unit 328, through the first pad 310 and the third pad 320. The data strobe signal reception unit 313 receives the internal data strobe signal IDQS transmitted from the data strobe signal transmission unit 329, through the second pad 311 and the fourth pad 321.

In the semiconductor systems configured as mentioned above, when the data DQ and the data strobe signal DQS are applied to the first semiconductor device 31 through the second semiconductor device 32, the timing difference between the data DQ and the data strobe signal DQS may be detected and corrected. The third semiconductor device 33 applies the data DQ to the second semiconductor device 32 by sequentially changing the input timing of the data DQ while fixing the input timing of the data strobe signal DQS. According to an embodiment, the third semiconductor device 33 may be realized in such a manner that it applies the data strobe signal DQS to the second semiconductor device 32 by sequentially changing the input timing of the data strobe signal DQS while fixing the input timing of the data DQ. The second semiconductor device 32 generates the phase information signal PD_INFO including information on the phase difference of the data strobe signal DQS and the data DQ, and applies the phase information signal PD_INFO to the third semiconductor device 33. The third semiconductor device 33 may detect and correct the phase difference of the data strobe signal DQS and the data DQ, based on the phase information signal PD_INFO. For example, the third semiconductor device 33 may apply the data DQ to the second semiconductor device 32 with input timings that are delayed by −0.15 tck, −0.1 tck, 0 tck, 0.1 tck and 0.15 tck when compared to the input timing of the data strobe signal DQS. In the examples where the phase information signal PD_INFO generated in the second semiconductor device 32 level-transitions at −0.1 tck, the third semiconductor device 33 may detect that the input timing of the data DQ is earlier than the input timing of the data strobe signal DQS, and may perform a correction of delaying the input timing of the data DQ by 0.1 tck.

Figure 4:
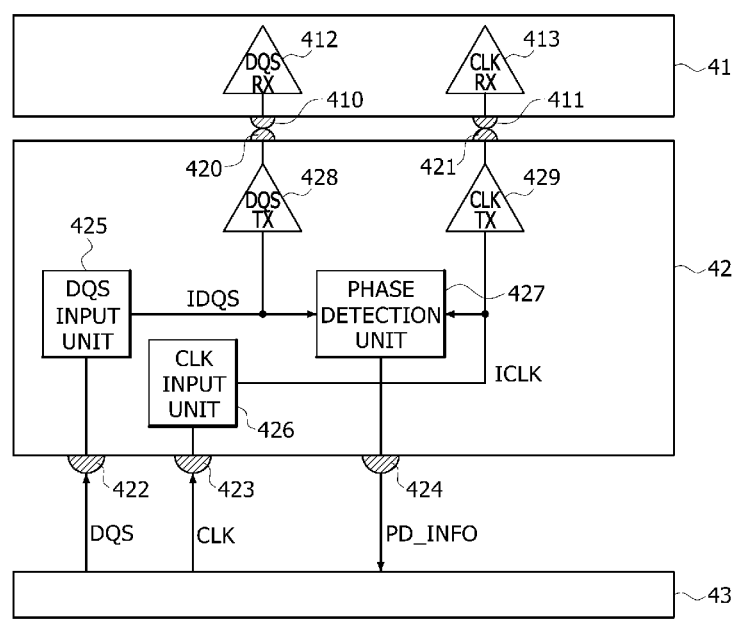
FIG. 4 is a block diagram illustrating a representation of an example of the configuration of a semiconductor system in accordance with an embodiment.

Referring to FIG. 4, a semiconductor system in accordance with an embodiment may include a first semiconductor device 41, a second semiconductor device 42, and a third semiconductor device 43. The first semiconductor device 41 may be configured by a first pad 410, a second pad 411, a data strobe signal reception (DQSRX) unit 412, and a clock reception (CLKRX) unit 413. The second semiconductor device 42 may include a third pad 420, a fourth pad 421, and a fifth pad 422. The second semiconductor device 42 may include a sixth pad 423, a seventh pad 424, and a data strobe signal input unit 425. The second semiconductor device 42 may include a clock (CLK) input unit 426, a phase detection unit 427, and a data strobe signal transmission (DQSTX) unit 428, and a clock transmission (CLKTX) unit 429. The first pad 410 and the third pad 420 are electrically coupled, and the second pad 411 and the fourth pad 421 are electrically coupled. The first pad 410, the second pad 411, the third pad 420 and the fourth pad 421 may be realized by micro bump pads.

The data strobe signal input unit 425 is applied with a data strobe signal DQS from the third semiconductor device 43 through the fifth pad 422, and generates an internal data strobe signal IDQS. The clock input unit 426 is applied with a clock CLK from the third semiconductor device 43 through the sixth pad 423, and generates an internal clock ICLK. The phase detection unit 427 detects the phase difference of the internal data strobe signal IDQS and the internal clock ICLK, and generates a phase information signal PD_INFO. The phase detection unit 427 outputs the phase information signal PD_INFO to the third semiconductor device 43 through the seventh pad 424. The data strobe signal reception unit 412 receives the internal data strobe signal IDQS transmitted from the data strobe signal transmission unit 428, through the first pad 410 and the third pad 420. The clock reception unit 413 receives the internal clock ICLK transmitted from the clock transmission unit 429, through the second pad 411 and the fourth pad 421.

In the semiconductor systems configured as mentioned above, when the data strobe signal DQS and the clock CLK are applied to the first semiconductor device 41 through the second semiconductor device 42, the timing difference between the data strobe signal DQS and the clock CLK may be detected and corrected. The third semiconductor device 43 applies the data strobe signal DQS to the second semiconductor device 42 by sequentially changing the input timing of the data strobe signal DQS while fixing the input timing of the clock CLK. According to an embodiment, the third semiconductor device 43 may be realized in such a manner that it applies the clock CLK to the second semiconductor device 42 by sequentially changing the input timing of the clock CLK while fixing the input timing of the data strobe signal DQS. The second semiconductor device 42 generates the phase information signal PD_INFO including information on the phase difference of the clock CLK and the data strobe signal DQS, and applies the phase information signal PD_INFO to the third semiconductor device 43. The third semiconductor device 43 may detect and correct the phase difference of the clock CLK and the data strobe signal DQS, based on the phase information signal PD_INFO. For example, the third semiconductor device 43 may apply the data strobe signal DQS to the second semiconductor device 42 with input timings that are delayed by −0.15 tck, −0.1 tck, 0 tck, 0.1 tck and 0.15 tck when compared to the input timing of the clock CLK. In the examples where the phase information signal PD_INFO generated in the second semiconductor device 42 level-transitions at −0.1 tck, the third semiconductor device 43 may detect that the input timing of the data strobe signal DQS is earlier than the input timing of the clock CLK, and may perform a correction of delaying the input timing of the data strobe signal DQS by 0.1 tck.

Figure 5:
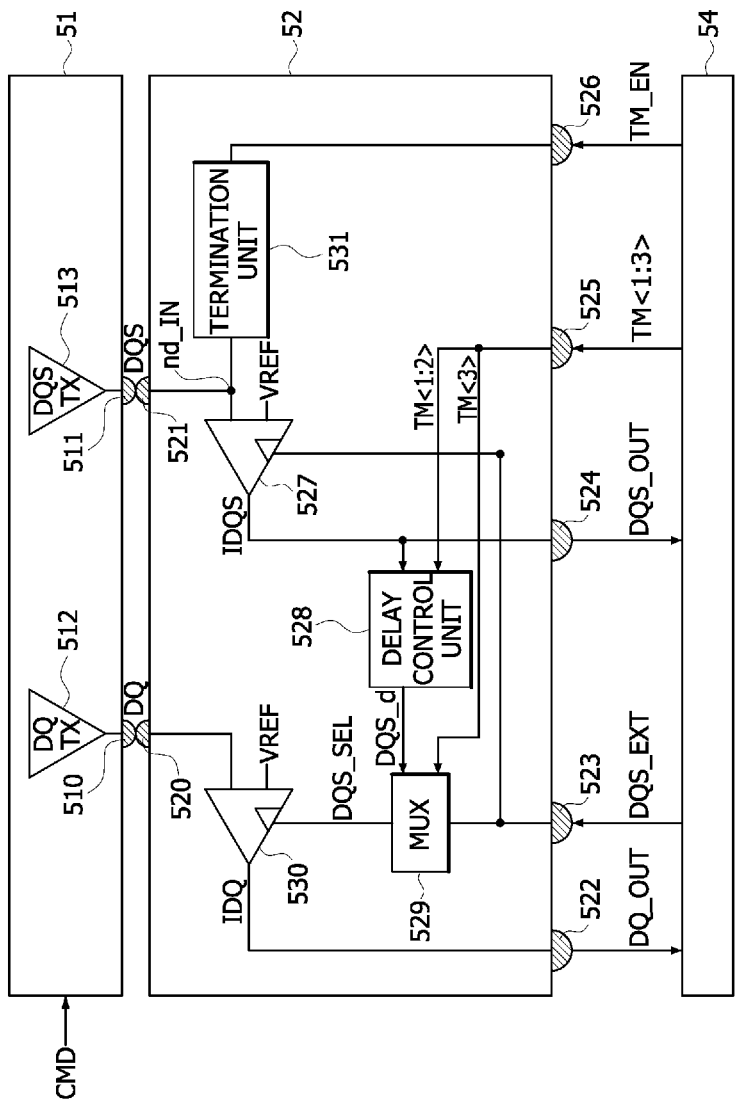
FIG. 5 is a block diagram illustrating a representation of an example of the configuration of a semiconductor system in accordance with an embodiment.

Referring to FIG. 5, a semiconductor system in accordance with an embodiment may include a first semiconductor device 51, a second semiconductor device 52, and a third semiconductor device 54. The first semiconductor device 51 may be configured by a first pad 510, a second pad 511, a data transmission (DQTX) unit 512, and a data strobe signal transmission (DQSTX) unit 513. The second semiconductor device 52 may include a third pad 520, a fourth pad 521, and a fifth pad 522. The second semiconductor device 52 may include a sixth pad 523, a seventh pad 524, and an eighth pad 525. The second semiconductor device 52 may include a ninth pad 526, a first input buffer 527, and a delay control unit 528. The second semiconductor device 52 may include a multiplexer (MUX) 529, a second input buffer 530, and a termination unit 531. The first pad 510 and the third pad 520 are electrically coupled, and the second pad 511 and the fourth pad 521 are electrically coupled. The first pad 510, the second pad 511, the third pad 520 and the fourth pad 521 may be realized by micro bump pads.

The data transmission unit 512 outputs data DQ stored in a memory cell (not shown), through the first pad 510, in a read operation performed in response to a command CMD. The data strobe signal transmission unit 513 outputs a data strobe signal DQS through the second pad 511.

The first input buffer 527 is inputted with the data strobe signal DQS through the fourth pad 521. The first input buffer 527 buffers the data strobe signal DQS with reference to a reference voltage VREF in synchronization with an external data strobe signal DQS_EXT inputted through the sixth pad 523, and generates an internal data strobe signal IDQS. The internal data strobe signal IDQS is outputted as an output data strobe signal DQS_OUT through the seventh pad 524. The delay control unit 528 delays the internal data strobe signal IDQS by a delay period that is determined according to the logic level combination of first test mode signals TM<1:2> (i.e., TM<1:3> includes first test mode signals TM<1:2> and second test mode signal TM<3>) inputted through the eighth pad 525, and generates a delayed data strobe signal DQS_d. The multiplexer 529 outputs the external data strobe signal DQS_EXT or the delayed data strobe signal DQS_d, as a selected data strobe signal DQS_SEL, in response to a second test mode signal TM<3> inputted through the eighth pad 525. The second input buffer 530 is inputted with the data DQ through the third pad 521. The second input buffer 530 buffers the data DQ with reference to the reference voltage VREF in synchronization with the selected data strobe signal DQS_SEL, and generates internal data IDQ. The internal data IDQ is outputted as output data DQ_OUT through the fifth pad 522.

Figure 6:
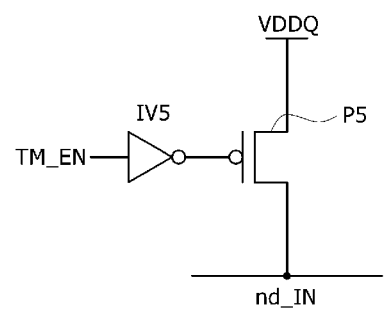
FIG. 6 is a circuit diagram illustrating a representation of an example of the termination unit illustrated in FIG. 5.
Figure 7:
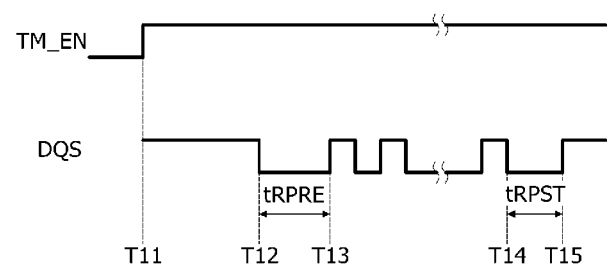
FIG. 7 is a representation of an example of a timing diagram to assist in the explanation of the operation of the termination unit illustrated in FIG. 6.

The termination unit 531 drives an internal node nd_IN through which the data strobe signal DQS is inputted, to a preset level, in response to a test mode enable signal TM_EN. The test mode enable signal TM_EN may be inputted through the ninth pad 526. The test mode enable signal TM_EN is a signal enabled in the example of entering a test mode. A level to which the termination unit 531 drives the internal node nd_IN in the test mode may be set variously according to embodiments. Referring to FIG. 6, there is illustrated an embodiment of the termination unit 531. The termination unit 531 may be configured by an inverter IV5 and a PMOS transistor P5. The termination unit 531 configured in this way drives the internal node nd_IN to a power supply voltage VDDQ as the PMOS transistor P5 is turned on in the example where the test mode enable signal TM_EN is at a logic high level due to entry into the test mode. The data strobe signal DQS inputted through the internal node nd_IN is driven to a logic high level in the test mode. A driving force for driving the data strobe signal DQS to the power supply voltage VDDQ in the test mode may be set to be small. Referring to FIG. 7, since the test mode enable signal TM_EN transitions to the logic high level upon entry to the test mode (i.e., time T11), the data strobe signal DQS is driven to the logic high level (i.e., time T11). In an embodiment, the data strobe signal DQS is set to be driven to a logic low level in a preamble period tRPRE (i.e., time T12 to time T13) and a postamble period tRPST (i.e., time T14 to time T15). A driving force for driving the data strobe signal DQS to the logic low level in the preamble period tRPRE and the postamble period tRPST may be set to be larger than the driving force for driving the data strobe signal DQS in the test mode. Since the data strobe signal DQS is driven to the logic high level in the test mode and is driven to the logic low level in the preamble period tRPRE and the postamble period tRPST, the preamble period tRPRE and the postamble period tRPST may be precisely measured.

In the semiconductor system configured as mentioned above, in the read operation of the first semiconductor device 51, the valid window of the data DQ outputted from the first semiconductor device 51 may be checked. In order to check the valid window of the data DQ, a scheme of outputting the data DQ in synchronization with the delayed data strobe signal DQS_d and a scheme of outputting the data DQ in synchronization with the external data strobe signal DQS_EXT applied from the third semiconductor device 54 may be used.

In the examples where the second test mode signal TM<3> is at logic low level (that may be set to a logic high level according to an embodiment), since the delayed data strobe signal DQS_d is outputted as the selected data strobe signal DQS_SEL, the internal data IDQ is outputted as the output data DQ_OUT in synchronization with the delayed data strobe signal DQS_d selected as the selected data strobe signal DQS_SEL. The delayed data strobe signal DQS_d is generated through delaying the internal data strobe signal IDQS by the delay period that is determined according to the logic level combination of the first test mode signals TM<1:2>. Therefore, the third semiconductor device 54 may check the valid window of the data DQ by being inputted with the output data DQ_OUT from the second semiconductor device 52 while changing the logic level combination of the first test mode signals TM<1:2>. For example, when the logic level combination of the first test mode signals TM<1:2> is changed to 'L,L', 'L,H', 'H,L' and 'H,H', (i.e., Low L, High H) the delayed data strobe signal DQS_d is generated by being delayed sequentially by a preset period, and the third semiconductor device 54 may check the valid window of the data DQ by checking a period in which the output data DQ_OUT is outputted at a preset logic level (that may be set to a logic high level or a logic low level according to an embodiment).

In the examples where the second test mode signal TM<3> is a logic high level (that may be set to the logic low level according to an embodiment), since the external data strobe signal DQS_EXT is outputted as the selected data strobe signal DQS_SEL, the internal data IDQ is outputted as the output data DQ_OUT in synchronization with the external data strobe signal DQS_EXT selected as the selected data strobe signal DQS_SEL. The external data strobe signal DQS_EXT is applied to the second semiconductor device 52 from the third semiconductor device 54. The third semiconductor device 54 may check the valid window of the data DQ by checking a period in which the output data DQ_OUT is outputted at the preset logic level while changing sequentially the input timing of the external data strobe signal DQS_EXT.

As described above, in the semiconductor system in accordance with an embodiment, by generating the internal data IDQ in synchronization with the delayed data strobe signal DQS_d generated in the second semiconductor device 52 or the external data strobe signal DQS_EXT applied to the second semiconductor device 52 from the third semiconductor device 54, the valid window of the data DQ may be easily checked. Also, since the termination unit 531 is disposed, the preamble period tRPRE and the postamble period tRPST of the data strobe signal DQS may be precisely measured.

As is apparent from the above descriptions, according to the various embodiments, advantages are provided in that the interface characteristic of a semiconductor device including micro bump pads may be easily checked and corrected using a device disposed between the semiconductor device and test equipment.

Figure 8:
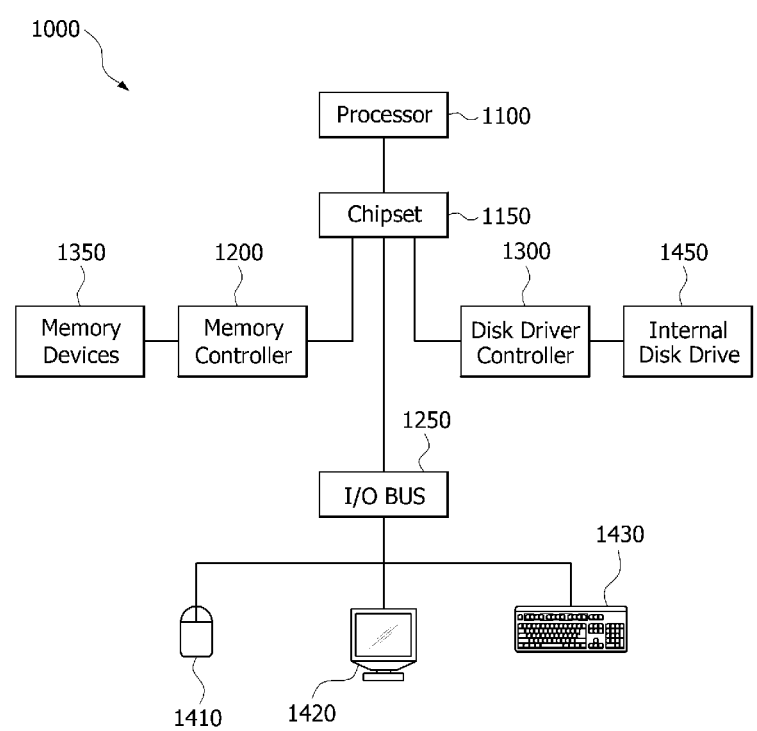
FIG. 8 illustrates a block diagram of an example of a representation of a system employing the semiconductor system and/or semiconductor device in accordance with the embodiments discussed above with relation to FIGS. 1-7.

The semiconductor system and/or semiconductor device discussed above (see FIGS. 1-7) are particular useful in the design of memory devices, processors, and computer systems. For example, referring to FIG. 8, a block diagram of a system employing the semiconductor system and/or semiconductor device in accordance with the embodiments are illustrated and generally designated by a reference numeral 1000. The system 1000 may include one or more processors or central processing units ("CPUs") 1100. The CPU 1100 may be used individually or in combination with other CPUs. While the CPU 1100 will be referred to primarily in the singular, it will be understood by those skilled in the art that a system with any number of physical or logical CPUs may be implemented.

A chipset 1150 may be operably coupled to the CPU 1100. The chipset 1150 is a communication pathway for signals between the CPU 1100 and other components of the system 1000, which may include a memory controller 1200, an input/output ("I/O") bus 1250, and a disk drive controller 1300. Depending on the configuration of the system, any one of a number of different signals may be transmitted through the chipset 1150, and those skilled in the art will appreciate that the routing of the signals throughout the system 1000 can be readily adjusted without changing the underlying nature of the system.

As stated above, the memory controller 1200 may be operably coupled to the chipset 1150. The memory controller 1200 may include at least one semiconductor system and/or semiconductor device as discussed above with reference to FIGS. 1-7. Thus, the memory controller 1200 can receive a request provided from the CPU 1100, through the chipset 1150. In alternate embodiments, the memory controller 1200 may be integrated into the chipset 1150. The memory controller 1200 may be operably coupled to one or more memory devices 1350. In an embodiment, the memory devices 1350 may include the at least one semiconductor system and/or semiconductor device as discussed above with relation to FIGS. 1-7, the memory devices 1350 may include a plurality of word lines and a plurality of bit lines for defining a plurality of memory cells. The memory devices 1350 may be any one of a number of industry standard memory types, including but not limited to, single inline memory modules ("SIMMs") and dual inline memory modules ("DIMMs"). Further, the memory devices 1350 may facilitate the safe removal of the external data storage devices by storing both instructions and data.

The chipset 1150 may also be coupled to the I/O bus 1250. The I/O bus 1250 may serve as a communication pathway for signals from the chipset 1150 to I/O devices 1410, 1420 and 1430. The I/O devices 1410, 1420 and 1430 may include a mouse 1410, a video display 1420, or a keyboard 1430. The I/O bus 1250 may employ any one of a number of communications protocols to communicate with the I/O devices 1410, 1420, and 1430. Further, the I/O bus 1250 may be integrated into the chipset 1150.

The disk drive controller 1450 (i.e., internal disk drive) may also be operably coupled to the chipset 1150. The disk drive controller 1450 may serve as the communication pathway between the chipset 1150 and one or more internal disk drives 1450. The internal disk drive 1450 may facilitate disconnection of the external data storage devices by storing both instructions and data. The disk drive controller 1300 and the internal disk drives 1450 may communicate with each other or with the chipset 1150 using virtually any type of communication protocol, including all of those mentioned above with regard to the I/O bus 1250.

It is important to note that the system 1000 described above in relation to FIG. 8 is merely one example of a system employing the semiconductor system and/or semiconductor device as discussed above with relation to FIGS. 1-7. In alternate embodiments, such as cellular phones or digital cameras, the components may differ from the embodiments illustrated in FIG. 8.

While various embodiments have been described above, it will be understood to those skilled in the art that the embodiments described are by way of example only. Accordingly, the semiconductor device and the semiconductor system including the same described herein should not be limited based on the described embodiments.

What is claimed is:
1. A semiconductor system comprising:
a first semiconductor device including a first pad group;
a second semiconductor device; and
a third semiconductor device,
wherein the second semiconductor device includes:
a second pad group electrically coupled with the first pad group;
a third pad group configured for the input and output of signals from and to the third semiconductor device;
an interface unit electrically coupled to the first pad group; and
a selective transfer unit configured to electrically couple the third pad group to the first pad group or to the interface unit, in response to a test mode enable signal.
2. The semiconductor system according to claim 1, wherein the interface unit is configured to detect a phase information signal including information on a phase difference of a first interface signal and a second interface signal inputted through the third pad group, and output the phase information signal to the third pad group.
3. The semiconductor system according to claim 2, wherein the first interface signal is set to one of a command, an address, data and a data strobe signal, and the second interface signal is set to either one of a clock or a data strobe signal.
4. The semiconductor system according to claim 2, wherein the interface unit comprises:
a phase detection unit configured to receive the first interface signal and the second interface signal inputted through the third pad group, detect the phase difference of the first interface signal and the second interface signal, and generate the phase information signal;
a first transmission unit configured to transmit the first interface signal to the first semiconductor device through the second pad group; and
a second transmission unit configured to transmit the second interface signal to the first semiconductor device through the second pad group.
5. The semiconductor system according to claim 4, wherein the first semiconductor device comprises:
a first reception unit configured to receive the first interface signal transmitted from the first transmission unit, through the first pad group; and a second reception unit configured to receive the second interface signal transmitted from the second transmission unit, through the first pad group.

6. The semiconductor system according to claim 1, wherein the interface unit is configured to receive data and a data strobe signal outputted from the first semiconductor device, generate internal data from the data in synchronization with the data strobe signal or an external data strobe signal, and output the internal data to the third pad group.

7. The semiconductor system according to claim 6, wherein the first semiconductor device is configured to output the data and the data strobe signal to the first pad group by performing a read operation in response to a command inputted from an exterior.

8. The semiconductor system according to claim 6, wherein the external data strobe signal is applied through the third pad group from the third semiconductor device.

9. The semiconductor system according to claim 6, wherein the interface unit comprises:
- a data strobe signal driving unit configured to receive the data strobe signal and drive an internal data strobe signal, in synchronization with the external data strobe signal;
- a delay control unit configured to delay the internal data strobe signal in response to first test mode signals, and generate a delayed data strobe signal;
- a multiplexer configured to output the external data strobe signal or the delayed data strobe signal, as a selected data strobe signal, in response to a second test mode signal; and
- a data driving unit configured to receive the data and drive the internal data, in synchronization with the selected data strobe signal.

10. The semiconductor system according to claim 9, wherein the internal data strobe signal and the internal data are outputted to the third semiconductor device through the third pad group.

11. The semiconductor system according to claim 10, wherein the first test mode signals and the second test mode signal are applied through the third pad group from the third semiconductor device.

12. The semiconductor system according to claim 9, wherein the interface unit further comprises:
- a termination unit electrically coupled to an internal node, and configured to drive the internal node to a preset level while in a test mode,
- wherein the data strobe signal is inputted through the internal node.

13. A semiconductor system comprising:
- a first semiconductor device including a first pad group;
- a second semiconductor device; and
- a third semiconductor device,
- wherein the second semiconductor device includes:
  - a second pad group electrically coupled with the first pad group;
  - a third pad group configured for the input and output of signals from and to the third semiconductor device;
  - an interface unit configured to detect a phase information signal including information on a phase difference of a first interface signal and a second interface signal inputted through the third pad group, and configured to output the phase information signal to the third pad group.

14. The semiconductor system according to claim 13, wherein the first interface signal is set to one of a command, an address, data and a data strobe signal, and the second interface signal is set to one of either a clock or a data strobe signal.

15. The semiconductor system according to claim 13, wherein the interface unit comprises:
- a phase detection unit configured to receive the first interface signal and the second interface signal inputted through the third pad group, detect the phase difference of the first interface signal and the second interface signal, and generate the phase information signal;
- a first transmission unit configured to transmit the first interface signal to the first semiconductor device through the second pad group; and
- a second transmission unit configured to transmit the second interface signal to the first semiconductor device through the second pad group.

16. The semiconductor system according to claim 15, wherein the first semiconductor device comprises:
- a first reception unit configured to receive the first interface signal transmitted from the first transmission unit, through the first pad group; and
- a second reception unit configured to receive the second interface signal transmitted from the second transmission unit, through the first pad group.

17. A semiconductor system comprising:
- a first semiconductor device including a first pad group, and configured to output data and a data strobe signal;
- a second semiconductor device; and
- a third semiconductor device,
- wherein the second semiconductor device includes:
  - a second pad group electrically coupled with the first pad group;
  - a third pad group configured for the input and output of signals from and to the third semiconductor device;
  - an interface unit configured to receive the data and the data strobe signal, generate internal data from the data in synchronization with the data strobe signal or an external data strobe signal, and output the internal data to the third pad group.

18. The semiconductor system according to claim 17, wherein the external data strobe signal is applied through the third pad group from the third semiconductor device.

19. The semiconductor system according to claim 17, wherein the interface unit comprises:
- a data strobe signal driving unit configured to receive the data strobe signal and drive an internal data strobe signal, in synchronization with the external data strobe signal;
- a delay control unit configured to delay the internal data strobe signal in response to first test mode signals, and generate a delayed data strobe signal;
- a multiplexer configured to output the external data strobe signal or the delayed data strobe signal, as a selected data strobe signal, in response to a second test mode signal; and
- a data driving unit configured to receive the data and drive the internal data, in synchronization with the selected data strobe signal.

20. The semiconductor system according to claim 19, wherein the interface unit further comprises:
- a termination unit electrically coupled to an internal node, and configured to drive the internal node to a preset level while in a test mode,
- wherein the data strobe signal is inputted through the internal node.

* * * * *